(12) United States Patent
Kim et al.

(10) Patent No.: US 8,149,950 B2
(45) Date of Patent: Apr. 3, 2012

(54) METHOD AND SYSTEM FOR BASEBAND PREDISTORTION LINEARIZATION IN MULTI-CHANNEL WIDEBAND COMMUNICATION SYSTEMS

(75) Inventors: Wan Jong Kim, Coquitlam (CA); Kyoung Joon Cho, Coquitlam (CA); Jong Heon Kim, Yongsan-Gu (KR); Shawn Patrick Stapleton, Burnaby (CA)

(73) Assignee: Dali Systems Co. Ltd., George Town Grand Cayman (KY)

( * ) Notice: Subject to any disclaimer, the term of this patent is extended or adjusted under 35 U.S.C. 154(b) by 687 days.

(21) Appl. No.: 11/961,969

(22) Filed: Dec. 20, 2007

(65) Prior Publication Data

US 2008/0152037 A1 Jun. 26, 2008

Related U.S. Application Data

(60) Provisional application No. 61/012,416, filed on Dec. 7, 2007, provisional application No. 60/877,035, filed on Dec. 26, 2006.

(51) Int. Cl.
 *H04K 1/02* (2006.01)
(52) U.S. Cl. ........ 375/296; 341/151; 375/229; 375/233; 375/234; 379/340; 379/398
(58) Field of Classification Search .......................... None
 See application file for complete search history.

(56) References Cited

U.S. PATENT DOCUMENTS

| | | | |
|---|---|---|---|
| 4,638,248 A | 1/1987 | Schweickert | |
| 4,700,151 A | 10/1987 | Nagata | |
| 4,890,300 A | 12/1989 | Andrews | |
| 4,929,906 A | 5/1990 | Voyce et al. | |
| 5,049,832 A | 9/1991 | Cavers | |
| 5,121,412 A | 6/1992 | Borth | |
| 5,132,639 A | 7/1992 | Blauvelt et al. | |
| 5,396,190 A | 3/1995 | Murata | |
| 5,486,789 A | 1/1996 | Palandech et al. | |
| 5,579,342 A | 11/1996 | Crozier | |
| 5,675,287 A | 10/1997 | Baker et al. | |
| 5,678,198 A | 10/1997 | Lemson | |
| 5,732,333 A | 3/1998 | Cox et al. | |
| 5,757,229 A | 5/1998 | Mitzlaff | |
| 5,786,728 A | 7/1998 | Alinikula | |
| 5,936,464 A | 8/1999 | Grondahl | |
| 5,937,011 A | 8/1999 | Carney et al. | |
| 5,949,283 A * | 9/1999 | Proctor et al. ................ 330/149 |
| 5,959,499 A | 9/1999 | Khan et al. | |
| 5,963,549 A | 10/1999 | Perkins et al. | |
| 6,054,896 A * | 4/2000 | Wright et al. ................. 330/149 |
| 6,055,418 A | 4/2000 | Harris et al. | |
| 6,091,941 A | 7/2000 | Moriyama et al. | |
| 6,240,144 B1 | 5/2001 | Ha | |
| 6,242,979 B1 | 6/2001 | Li | |

(Continued)

*Primary Examiner* — David C. Payne
*Assistant Examiner* — Adolf Dsouza
(74) *Attorney, Agent, or Firm* — Kilpatrick, Townsend & Stockton, LLP

(57) ABSTRACT

An efficient baseband predistortion linearization method for reducing the spectral regrowth and compensating memory effects in wideband communication systems using effective multiplexing modulation technique such as wideband code division multiple access and orthogonal frequency division multiplexing is disclosed. The present invention is based on the method of piecewise pre-equalized lookup table based predistortion, which is a cascade of a lookup table predistortion and piecewise pre-equalizers, to reduce the computational complexity and numerical instability for desired linearity performance with memory effects compensation for wideband transmitter systems.

11 Claims, 11 Drawing Sheets

U.S. PATENT DOCUMENTS

| | | |
|---|---|---|
| 6,246,286 B1 | 6/2001 | Persson |
| 6,246,865 B1 | 6/2001 | Lee |
| 6,275,685 B1 | 8/2001 | Wessel et al. |
| 6,301,579 B1 | 10/2001 | Becker |
| 6,400,774 B1 | 6/2002 | Matsuoka et al. |
| 6,424,225 B1 | 7/2002 | Choi et al. |
| 6,512,417 B2 | 1/2003 | Booth et al. |
| 6,552,634 B1 | 4/2003 | Raab |
| 6,625,429 B1 | 9/2003 | Yamashita |
| 6,639,050 B1 | 10/2003 | Kieliszewski |
| 6,677,870 B2 | 1/2004 | Im et al. |
| 6,697,436 B1 | 2/2004 | Wright et al. |
| 6,703,897 B2 | 3/2004 | O'Falherty et al. |
| 6,741,663 B1 | 5/2004 | Tapio et al. |
| 6,747,649 B1 | 6/2004 | San-z Pastor et al. |
| 6,751,447 B1 | 6/2004 | Jin et al. |
| 6,963,242 B2 | 11/2005 | White et al. |
| 6,983,025 B2 | 1/2006 | Schell |
| 6,985,704 B2 | 1/2006 | Yang et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,079,818 B2 | 7/2006 | Khorram |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,151,913 B2 | 12/2006 | Ahmed |
| 7,158,765 B2 | 1/2007 | Blair et al. |
| 7,193,472 B2 | 3/2007 | Gotou et al. |
| 7,248,642 B1 | 7/2007 | Vella-Coleiro |
| 7,259,630 B2 | 8/2007 | Bachman et al. |
| 7,321,635 B2 | 1/2008 | Ocenasek et al. |
| 7,321,636 B2 | 1/2008 | Harel et al. |
| 7,372,918 B2 | 5/2008 | Muller et al. |
| 7,469,491 B2 | 12/2008 | McCallister et al. |
| 7,831,221 B2 | 11/2010 | Leffel et al. |
| RE42,287 E | 4/2011 | Apodaca et al. |
| 2002/0034260 A1 | 3/2002 | Kim |
| 2002/0044014 A1 | 4/2002 | Wright et al. |
| 2002/0080891 A1 | 6/2002 | Ahn et al. |
| 2002/0101937 A1 | 8/2002 | Antonio et al. |
| 2002/0101938 A1 | 8/2002 | Horaguchi et al. |
| 2002/0186783 A1 | 12/2002 | Opas et al. |
| 2002/0187761 A1 | 12/2002 | Im et al. |
| 2002/0193085 A1 | 12/2002 | Mathe et al. |
| 2003/0095608 A1 | 5/2003 | Duperray |
| 2003/0179829 A1 | 9/2003 | Pinckley et al. |
| 2003/0179830 A1 | 9/2003 | Eidson et al. |
| 2003/0207680 A1 | 11/2003 | Yang et al. |
| 2004/0017859 A1 | 1/2004 | Sills et al. |
| 2004/0240585 A1 | 12/2004 | Bishop et al. |
| 2005/0079834 A1 | 4/2005 | Maniwa et al. |
| 2005/0159117 A1 | 7/2005 | Bausov et al. |
| 2005/0262498 A1 | 11/2005 | Ferguson et al. |
| 2006/0012426 A1 | 1/2006 | Nezami |
| 2006/0270366 A1 | 11/2006 | Rozenblit et al. |
| 2007/0075780 A1 | 4/2007 | Krvavac et al. |
| 2007/0171234 A1 | 7/2007 | Crawfis et al. |
| 2007/0241812 A1 | 10/2007 | Yang et al. |

\* cited by examiner

| PD type | ACPR (Lower) | ACPR (Upper) |
|---|---|---|
| No PD | -40.4 dBc | -38.7 dBc |
| LUT | -56.4 dBc | -54.5 dBc |
| Hammerstein | -56.7 dBc | -54.2 dBc |
| The proposed | -65.1 dBc | -64.4 dBc |
| Memory Polynomial | -66.2 dBc | -65.1 dBc |

| PD type | ACPR (Lower) | ACPR (Upper) |
|---|---|---|
| No PD | -35.4 dBc | -36.4 dBc |
| LUT | -45.4 dBc | -47.5 dBc |
| Hammerstein | -45.5 dBc | -48.8 dBc |
| The proposed | -51.1 dBc | -53.4 dBc |
| Memory Polynomial | -52.2 dBc | -54.5 dBc |

| Method | | The proposed |
|---|---|---|
| LUT PD output | ADD/SUB | 2 |
| | MPY | 4 |
| | Memory size (LUT) | 2N |
| 1 Iteration | ADD/SUB | 16 |
| | MPY | 20 |
| | Memory size | - |
| Filtering | ADD/SUB | 4L-2 |
| | MPY | 4L |
| | Memory size | 2L |
| Filter Update | ADD/SUB | 8L |
| | MPY | 8L+2 |
| | Memory size | (2N+1)L |
| Total Operations | | 12L+16 : ADD/SUB<br>14L+26 : MPY<br>2NL+3L+2N : Memory size |

N is the number of LUT entries and L is the number of taps.

FIGURE 9

| Method | | Memory polynomial |
|---|---|---|
| PD output | ADD/SUB | $4O+K-1$ |
| | MPY | $6O$ |
| | Memory Size | $2K$ |
| 1 Iteration | ADD/SUB | $12O^2+10O+K+1$ |
| | MPY | $14O^2+18O+4$ |
| | Memory size | $2O+2$ |
| Total Operations | | $12O^2+14O+2K$ : ADD/SUB<br>$14O^2+24O+4$ : MPY<br>$2O+2K+2$ : Memory size |

O is equal to P(K+1), where P is the polynomial order and K is the number of memory terms.

FIGURE 10

METHOD AND SYSTEM FOR BASEBAND PREDISTORTION LINEARIZATION IN MULTI-CHANNEL WIDEBAND COMMUNICATION SYSTEMS

RELATED APPLICATIONS

This application claims the benefit of U.S. Provisional Patent Application Ser. No. 60/877,035, filed Dec. 26, 2006, and having the same inventors as the present case, and also claims the benefit of U.S. Provisional Application Ser. No. 61/012,416, filed Dec. 7, 2007, both of which are incorporated herein by reference.

FIELD OF THE INVENTION

The present invention generally relates to wideband communication systems using multiplexing modulation techniques. More specifically, the present invention relates to methods and systems for baseband predistortion linearization to compensate for nonlinearities and memory effects of multi-channel wideband wireless transmitters.

BACKGROUND OF THE INVENTION

The linearity and efficiency of radio frequency (RF) power amplifiers (PAs) have been a critical design issue for non-constant envelope digital modulation schemes which have high peak-to-average-power ratios (PARs) as the importance of spectral efficiency in wireless communication systems increases. RF Pas have nonlinearities that generate amplitude modulation-amplitude modulation (AM-AM) and amplitude modulation-phase modulation (AM-PM) distortion at the output of the PA. These effects create spectral regrowth in the adjacent channels and in-band distortion which degrades the error vector magnitude (EVM).

The relationship between linearity and efficiency is a tradeoff since power efficiency is very low when the amplifier operates in its linear region and increases as the amplifier is driven into its compression region. In order to enhance linearity and efficiency at the same time, linearization techniques are typically applied to the RF PAs. Various linearization techniques have been proposed such as feedback, feedforward and predistortion.

One technique is baseband digital predistortion (PD) which typically uses a digital signal processor. Digital predistortion can achieve improved linearity and improved power efficiency with reduced system complexity when compared to the widely used conventional feedforward linearization technique. A software implementation provides the digital predistorter with re-configurability suitable for multi-standards environments. In addition, a PA using an efficiency enhancement technique such as a Doherty power amplifier (DPA) is able to achieve higher efficiencies than traditional PA designs at the expense of linearity. Therefore, combining digital predistortion with a PA using an efficiency enhancement technique has the potential to improve system linearity and overall efficiency.

However, most digital PDs presuppose that PAs have no memory or a weak memory. This is impractical in wideband applications where memory effects cause the output signal to be a function of current as well as past input signals. The sources of memory effects in PAs include self-heating of the active device (also referred to as long time constant or thermal memory effects) and frequency dependencies of the active device, related to the matching network or bias circuits (also referred to as short time constant or electrical memory effects). As signal bandwidth increases, memory effects of PAs become significant and limit the performance of memoryless digital PDs.

Various approaches have been suggested for overcoming memory effects in digital PDs. For the short-term memory effects, a Volterra filter structure was applied to compensate memory effects using an indirect learning algorithm, but the number of optimization coefficients is very large as the order increases. This complexity makes the Volterra filter based PD extremely difficult to implement in real hardware. A memory polynomial structure, which is a simplified version of the Volterra filter, has been proposed in order to reduce the number of coefficients, but even this simplified version still requires a large computational load. In addition, such a memory polynomial based PD suffers from a numerical instability when higher order polynomial terms are included because a matrix inversion is required for estimating the polynomial coefficients. An alternative, yet equally complex structure based on orthogonal polynomials has been utilized to alleviate the numerical instability associated with the traditional polynomials. To further reduce the complexity at the expense of the performance, the Hammerstein predistorter, which is a finite impulse response (FIR) filter or a linear time invariant (LTI) system followed by a memoryless polynomial PD, has been proposed. The Hammerstein predistorter assumed that the PA models used follow a Wiener model structure which is a memoryless nonlinearity followed by a finite impulse response (FIR) filter or a linear time invariant (LTI) system.

This implementation means that the Hammerstein structure can only compensate for memory effects coming from the RF frequency response. Therefore, if the RF frequency response is quite flat, the Hammerstein PD cannot correct for any other types of memory effects, such as bias-induced and thermal memory effects.

Most recently, a static lookup table (LUT) digital baseband PD cascaded with a sub-band filtering block has been used in order not to compensate for electrical memory effects, but to combat gain and phase variation due to temperature changes of the PA after an initial setting for the fixed LUT PD.

Hence, there has been a long-felt need for a baseband predistortion linearization method able to compensate for not only RF frequency response memory effects but also bias-induced or thermal memory effects in multi-channel wideband wireless transmitters.

SUMMARY OF THE INVENTION

Accordingly, the present invention substantially overcomes many of the foregoing limitations of the prior art, and provides a system and method of baseband predistortion linearization that compensates for nonlinearities as well as memory effects found in multi-channel wideband wireless transmitters. This result is achieved through the use of piecewise pre-equalized PD utilizing a lookup table. With this approach, the present invention is able to compensate for electrical and thermal memory effects while at the same time reducing the computational complexity and the numerical instability of the system as compared with prior art systems using a memory polynomial PD algorithm, while the present invention is comparable to a memory polynomial PD in terms of the resulting linearity in the performance of a multi-band PA.

Further objects and advantages of the invention can be more fully understood from the following detailed description taken in conjunction with the accompanying drawings in which:

THE FIGURES

FIG. 9 is a graph showing complexity estimation of the piecewise pre-equalized PD of the present invention.

FIG. 10 is a graph showing complexity estimation of the memory polynomial PD.

DETAILED DESCRIPTION OF THE INVENTION

To overcome the computational complexity and numerical instability of the memory polynomial PD found in the prior art, The present invention, therefore, utilizes an adaptive LUT-based digital predistortion system with a LUT that has been pre-equalized to compensate for memory effects, so as to achieve less computational load than the prior art while also reducing the adjacent channel power ratio (ACPR) to substantially the same degree as the memory polynomial PD has achieved. The system provided by the present invention is therefore referred to as a piecewise pre-equalized, lookup table based predistortion (PELPD) system hereafter.

Preferred and alternative embodiments of the PELPD system according to the present invention will now be described in detail with reference to the accompanying drawings.

Figure 1:
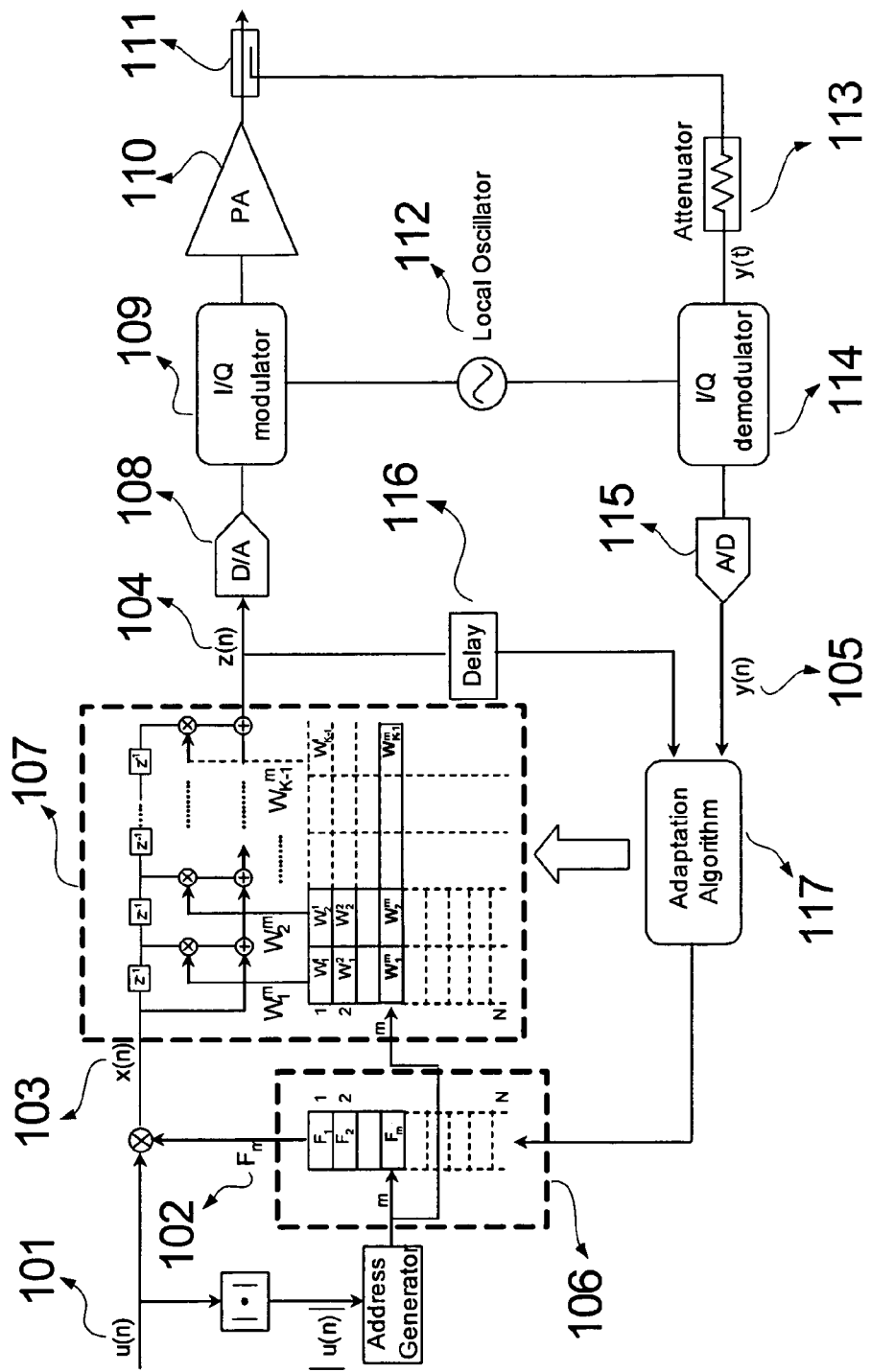
FIG. 1 is a schematic diagram showing a piecewise pre-equalized LUT predistortion system in accordance with the invention.

FIG. 1 is a schematic diagram showing an embodiment of a PELPD system in accordance with the invention. As illustrated, the linear magnitude addressing method for the LUT 106 indexing is used as follows:

$$m = \text{round}(|u(n)| \cdot N)$$

where u(n) is the input signal 101 and the round function returns the nearest integer number which is the index (m) and N is the LUT 106 size.

The digital complex baseband input signal samples 101 are multiplied prior to pre-equalization 107 by complex coefficients 102 drawn from LUT entries as follows $$x(n) = u(n) \cdot F_m(|u(n)|)$$

where $F_m(|u(n)|)$ is the complex coefficient 102 corresponding to an input signal 101 magnitude for compensating AM to AM and AM to PM distortions of the PA 110.

N by K−1 filter coefficients in the LUT of the piecewise pre-equalizer 107 are used to compensate for memory effects, where N is the depth of the LUT and the FIR filter has K taps. In some embodiments, the piecewise pre-equalizers 107 use a FIR filter rather than an infinite impulse response (IIR) filter because of stability issues, although a FIR filter is not necessarily required for all embodiments. The output 104 of the pre-equalizers can be described by $$z(n) = \sum_{k=0}^{K-1} W_k^m(|u(n)|) \cdot x(n-k)$$

$$= \sum_{k=0}^{K-1} W_k^m(|u(n)|) \cdot u(n-k) \cdot F_m(|u(n-k)|)$$

where $W_k^m(|u(n)|)$ is the k-th tap and m-th indexed coefficient corresponding to the magnitude of the input signal, u(n) 101. Also, $W_k^m(|u(n)|)$ is a function of $|u(n)|$ and $F_m$ 102 is a function of $|u(n-k)|$. For analysis purposes, the memoryless LUT 106 ($F_m$) structure can be replaced by a polynomial model as follows:

$$F_m(|u(n-k)|) = \sum_{p=1}^{P} b_{2p-1} \cdot |u(n-k)|^{2(p-1)}$$

where 2p−1 is the polynomial order and b is a complex coefficient corresponding to the polynomial order. Moreover, it is noted that the tap coefficients and memoryless LUT coefficients ($F_m$) 102 depend on u(n) and u(n−k), respectively.

Therefore, each piece of the equalizer can be expressed using a polynomial equation by $$z(n) = \sum_{k=0}^{K-1} W_k^m(|u(n)|) \cdot \sum_{p=1}^{P} b_{2p-1} \cdot u(n-k) \cdot |u(n-k)|^{2(p-1)}$$

where $W_k^m(|u(n)|)$ is the k-th tap coefficient with the m-th index being a function of $|u(n)|$. Without loss of generality, the piecewise pre-equalizers 107 can be defined similarly using a l-th order polynomial, $$z(n) = \sum_{k=0}^{K-1}\sum_{l=1}^{L} w_{k,2l-1} \cdot |u(n)|^{2(l-1)} \times \sum_{p=1}^{P} b_{2p-1} \cdot u(n-k) \cdot |u(n-k)|^{2(p-1)}$$

where $w_{k,l}$ is the k-th tap and l-th order coefficient.

After digital-to-analog converting 108 of z(n) 104, this signal is up-converted 109 to RF, amplified by the PA 110 generating distortions, attenuated 113, down-converted 114 to baseband, and then finally analog-to-digital converted 115 and applied to the delay 116 estimation algorithm 117. The feedback signal, that is, the output of the PA 110 with delay, y(n−Δ) 105 can be described by $$y(n-\Delta) = G(|z(n-\Delta)|) \cdot e^{j \cdot \Phi(|z(n-\Delta)|)}$$

where $G(\cdot)$ and $\Phi(\cdot)$ is AM/AM and AM/PM distortions of the PA 110, respectively and Δ is the feedback loop delay. For estimating Δ, a correlation technique was applied as follows:

$$R(d) = \frac{1}{N}\sum_{n=0}^{N-1} z(n) \cdot y^*(n+d)$$

where d is the delay variable and N is the block size to correlate.

After delay 116 estimation, the memoryless LUT 106 coefficients can be estimated by the following equation which is the least mean square (LMS) algorithm with indirect learning.

$$F_m(|u(n+1)|) = F_m(|u(n)|) + \mu \cdot u(n) \cdot e(n)$$

where n is the iteration number, μ is the stability factor and e(n) is $x(n) - y(n) \cdot F_m(|x(n)|)$.

It should be pointed out that addressing already generated can be reused for indexing y(n) 105 which is a distorted signal able to cause another error due to incorrect indexing. During this procedure, the samples, x(n) 103, should bypass by the piecewise pre-equalizers 107. After convergence of this indirect learning LMS algorithm, the equalizers 107 are activated. An indirect learning method with an LMS algorithm has also been utilized for adaptation of the piecewise filter coefficients. The input of the multiple equalizers 107 in the feedback path is written in vector format as $$y_{FI}(n) = [y_F(n) y_F(n-1) \ldots y_F(n-K+1)]$$

where $y_F(n)$ is the post LUT output, that is, $y(n) \cdot F_m(|y(n)|)$.

Therefore, the multiple FIR filter outputs, $y_{FO}(n)$, can be derived in vector format using the following equations.

$$y_{FO}(n) = W^m \cdot y_{FI}(n)^T$$

$$W^m = [W_0^m W_1^m \ldots W_{K-1}^m]$$

where T is a transpose operator.

Adaptation of the tap coefficients of the pre-equalizers 107 can be obtained as follows:

$$W^m(|u(n+1)|) = W^m(|u(n)|) + \mu \cdot (y_{FI}(n)^T)^* \cdot E(n)$$

where E(n) is the error signal between z(n) and yFO(n), and μ is the step size (* represents the complex conjugate). The adaptation algorithm determines the values of the coefficients by comparing the feedback signal and a delayed version of the input signal.

Referring to the feedback path beginning at output 111, it will be appreciated that several alternatives exist for using such feedback to update the LUT values or polynomial coefficients. In some embodiments, the output of the PA is converted to baseband, and the resulting baseband signal is compared to the input signal. The resulting error is used to correct the LUT values and coefficients. In other embodiments, the output from the PA is spectrally monitored and the out of band distortion is monitored using a downconverter, bandpass filter and power detector. The power detector value is then used to adjust the LUT values or polynomial coefficients.

Figure 2:
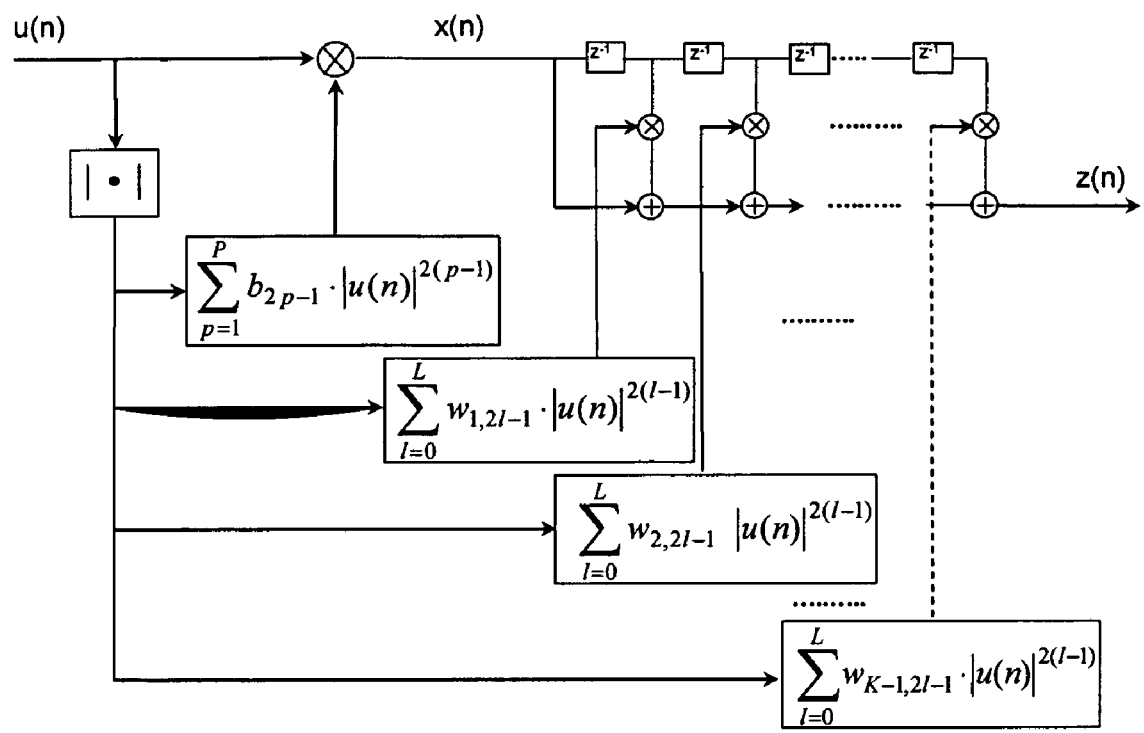
FIG. 2 is a schematic diagram showing a polynomial-based embodiment of the equalizer 107 of FIG. 1.

FIG. 2 illustrates the corresponding block diagram of the piecewise pre-equalizers 107 PD when polynomial equations are utilized. The polynomial representation requires too many complex multiplications similar to the Volterra series. The complexity is reduced when a PELPD-based approach, as shown in FIG. 1, is utilized, because fewer calculations are required, although more memory may be required. It will be appreciated from the discussion herein that the pre-equalizing portion is adaptive and designed to correct memory effects, while the lut serves primarily to pre-distort to correct the other nonlinearities found in commercial PA's.

Figure 3A:
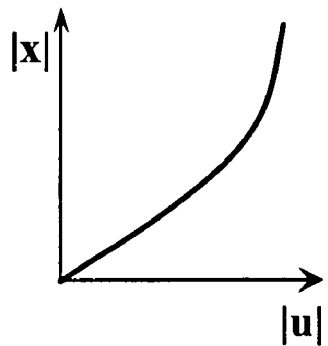
FIG. 3A is a graph showing complex gain adjuster response.
Figure 3B:
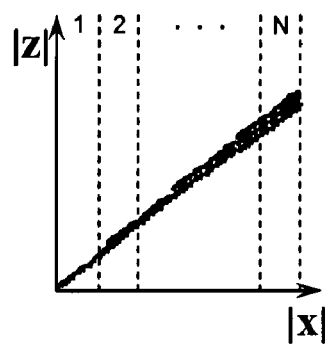
FIG. 3B is a graph showing piecewise equalizer response in accordance with the invention.
Figure 3C:
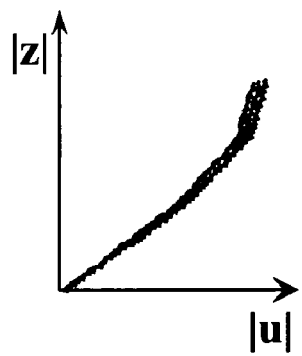
FIG. 3C is a graph showing response of the cascade of complex gain adjuster and piecewise equalizers in accordance with the invention.
Figure 3D:
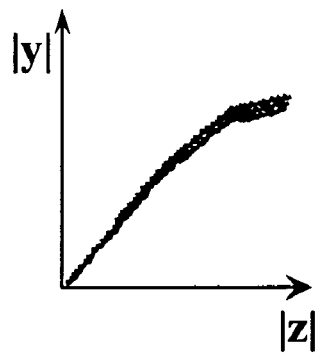
FIG. 3D is a graph showing a power amplifier response.
Figure 3E:
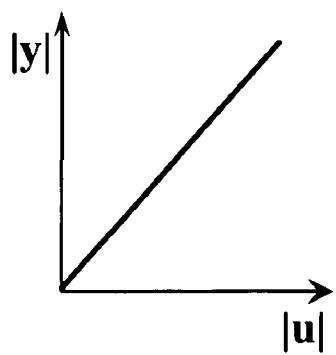
FIG. 3E is a graph showing detailed response from the response of the cascade of complex gain adjuster and piecewise equalizers and the complex gain adjuster response.

FIGS. 3A-3D are graphical explanations of the PELPD of the present invention. A typical memoryless predistorter response is shown in FIG. 3A. FIG. 3B demonstrates the hysteresis created by the piecewise pre-equalizers divided into N pieces. Since the hysteresis of the power amplifier is not necessarily uniformly distributed over the whole input magnitude range, the piecewise pre-equalizers are applied to achieve a uniform compensation across the entire input range. The output of the PELPD of the present invention is illustrated in FIG. 3C, which can be thought of as resulting from a cascade of FIGS. 3A and 3B. FIG. 3D shows the response of a typical power amplifier response and FIG. 3B results in the PELPD of the present invention as represented in FIG. 3C. FIG. 3D shows the response of a typical power amplifier response with memory. The desired linear response in FIG. 3E is achieved after FIG. 3C and FIG. 3D are cascaded.

In order to examine the performance of the PELPD of the present invention, the behavioral modeling of a PA based on time domain measurement samples was first carried out. The behavioral model was based on the truncated Volterra model. A 300 W peak envelope power (PEP) Doherty PA using two 170 W push-pull type laterally diffused metal oxide semiconductors (LDMOS) at the final stage was designed. This Doherty PA operates at 2140 MHz band and has 61 dB of gain and 28% power added efficiency (PAE) at an average 30 W output power. To construct the PA model based on measurements of the actual PA, the test bench was utilized [K. Mekechuk, W. Kim, S. Stapleton, and J. Kim, "Linearinzing Power Amplifiers Using Digital Predistortion, EDA Tools and Test Hardware," High Frequency Electronics, pp. 18-27, April 2004]. Based on the behavioral model, various types of PDs including a memoryless LUT PD, a Hammerstein PD, the PELPD of the present invention and a memory polynomial PD have been simulated and the adjacent channel power ratio (ACPR) performances are compared. The LUT size was fixed to 128 entries through all simulations, which is a compromise size considering quantization effects and memory size. Those skilled in the art will recognize that the amount of compensation for nonlinearities is related to the size of the LUT 106. Increases in LUT size, while yielding a more accurate representation of the nonlinearities, comes at the cost of more effort in the adaptation. Thus, selection of LUT size is a trade-off between accuracy and complexity.

As a test signal, a single downlink W-CDMA carrier with 64 dedicated physical channels (DPCH) of Test Mode based on 3rd Generation Partnership Project (3GPP) standard specifications, which has 3.84 Mchips/s and 9.8 dB of a crest factor. First, an eight tone signal with 500 kHz spacing which has 9.03 dB of PAR and 4 MHz bandwidth, which is comparable to a W-CDMA signal, was used for verifying the proposed method.

Figure 4A:
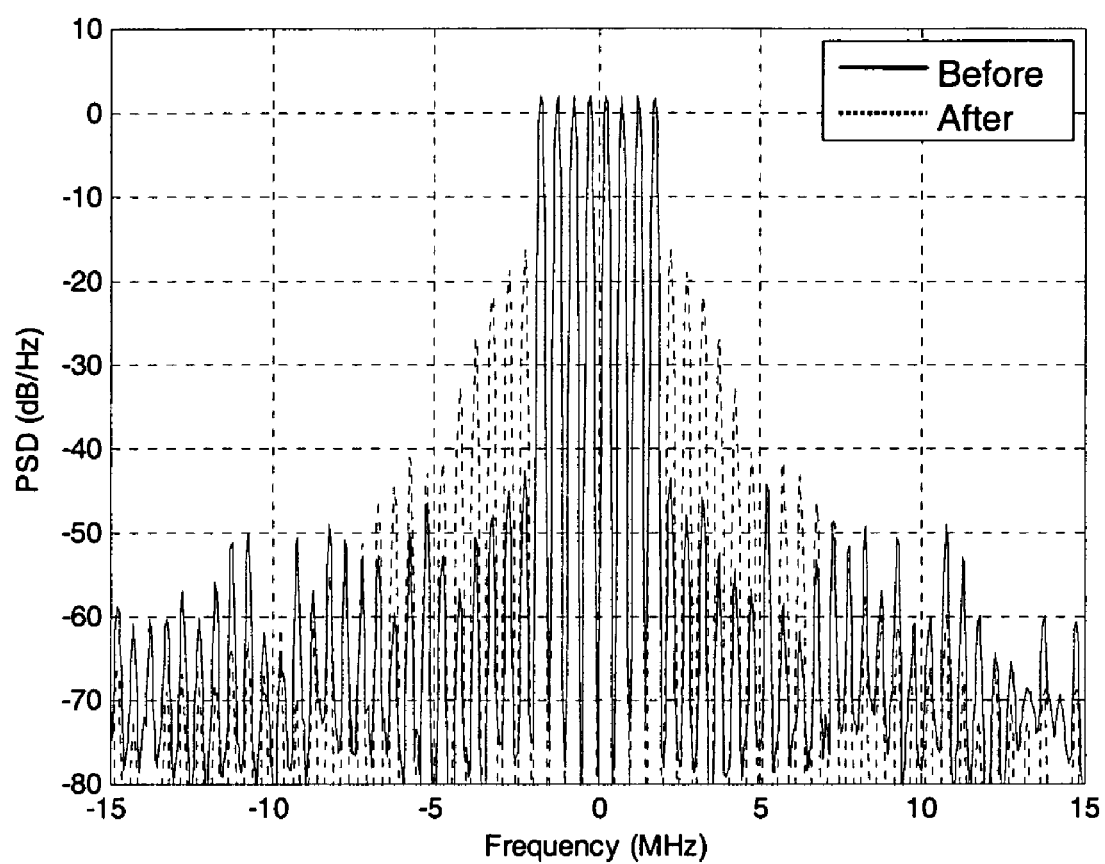
FIG. 4A is a graph showing representative linearization results before and after linearization with an embodiment of a memoryless LUT PD using an eight tone test signal with 500 kHz spacing.
Figure 4B:
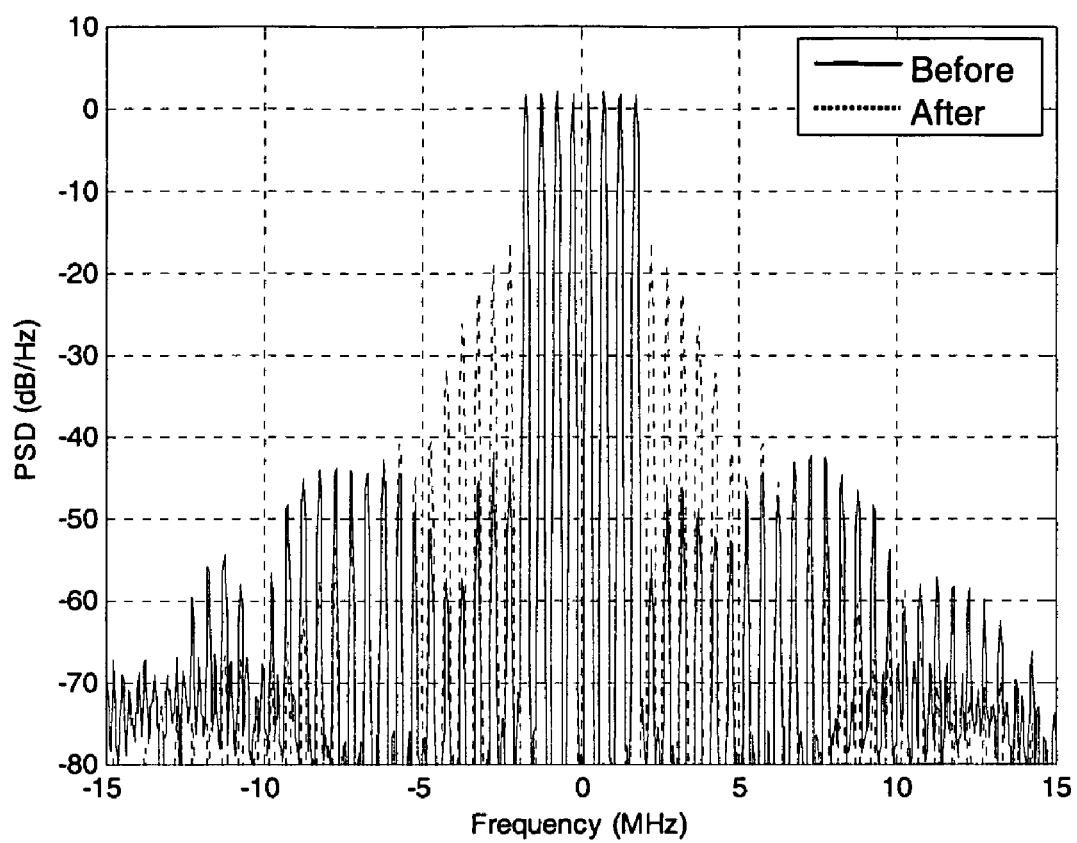
FIG. 4B is a graph showing representative linearization results before and after linearization with a LUT Hammerstein PD using an eight tone test signal with 500 kHz spacing.
Figure 4C:
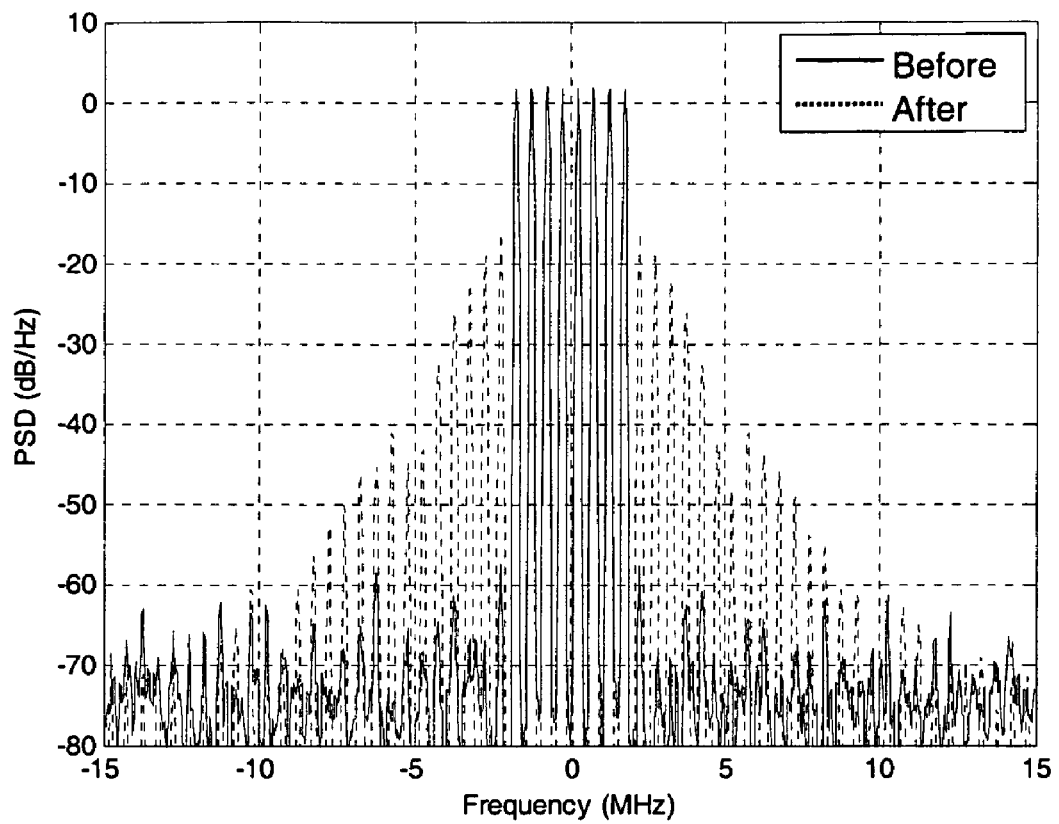
FIG. 4C is a graph showing representative linearization results before and after linearization with a piecewise pre-equalized PD of the present invention using eight tone test signal with 500 kHz spacing.
Figure 4D:
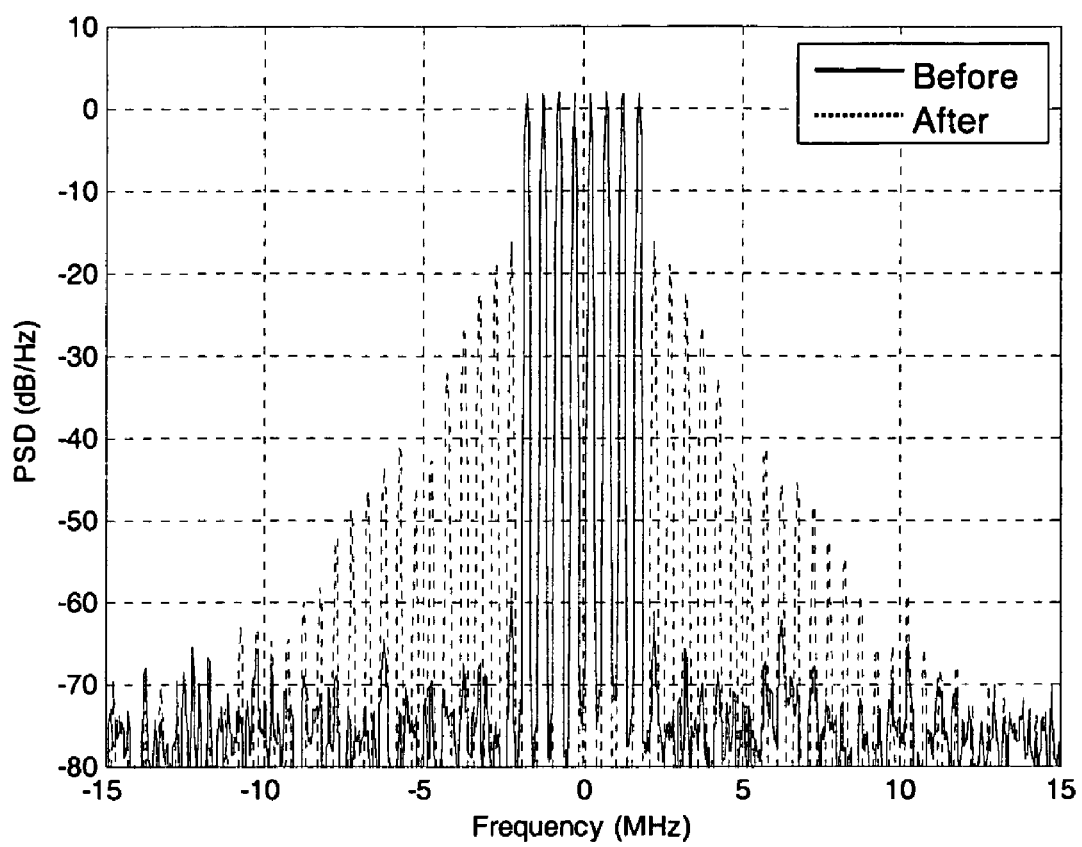
FIG. 4D is a graph showing representative linearization results before and after linearization with a memory polynomial PD using an eight tone test signal with 500 kHz spacing.

FIGS. 4A-4D are graphs showing representative linearization results before and after linearization of the four types of PD. As shown in FIG. 4A, a conventional memoryless LUT PD was able to improve the linearity and also compensate for the memory effects. FIG. 4B shows a conventional Hammerstein PD which deteriorates the performance above 10 MHz and improves it within a 10 MHz bandwidth. If the RF frequency response in the main signal path is quite flat, the Hammerstein PD is not able to correct any other memory effects except for frequency response memory effects. There is also no obvious improvement for reducing spectral regrowth using the conventional Hammerstein PD. It is very clear that the ability of the Hammerstein PD for suppressing distortions coming from memory effects is quite limited. FIG. 4C shows the performance of the PELPD of the present invention (with 2 taps). FIG. 4D illustrates the performance of a conventional memory polynomial PD (with $5^{th}$ order and two memory terms). By comparing FIGS. 4A-4D, it can be seen that the PELPD of the present invention is comparable to the memory polynomial PD in terms of ACPR performance.

Figures 5, 6:
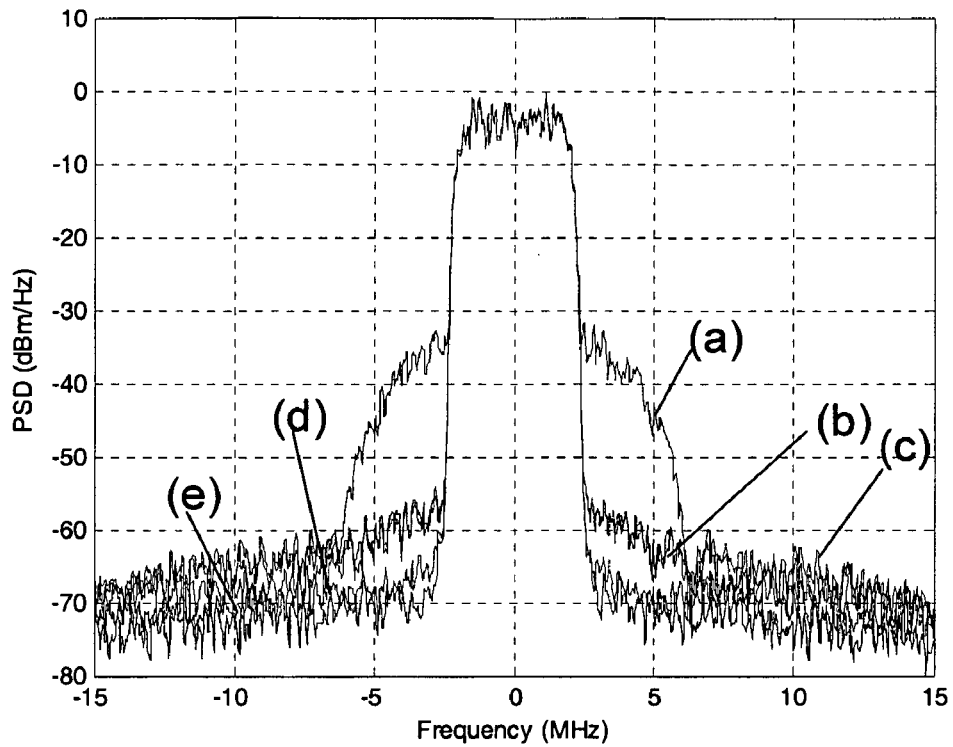
FIG. 5 is a graph showing representative linearization results for the four types of PDs consisting of a memoryless LUT PD, a LUT Hammerstein PD, a piecewise pre-equalized PD of the present invention, and a memory polynomial PD using a sigble W-CDMA carrier, respectively.
FIG. 6 is a graph showing performance comparisons of the simulation results of the ACPR for the four types of PD consisting of a memoryless LUT PD, a LUT Hammerstein PD, a piecewise pre-equalized PD of the present invention, and a memory polynomial PD using a single W-CDMA carrier, respectively.

FIG. 5 is a graph showing linearization results for the four types of PD mentioned above. A single W-CDMA carrier was applied to the LUT PD, the LUT Hammerstein PD, the PELPD of the present invention, and the memory polynomial PD.

FIG. 6 is a graph showing performance comparisons of the simulation results of the ACPR for the 4 types of, respectively. The conventional Hammerstein PD was unable to improve any distortions coming from memory effects over the memoryless PD. The PELPD of the present invention could suppress distortions due to nonlinearities as well as memory effects of the PA.

After verifying the ACPR performance of the PELPD of the present invention in the simulations based on the behavioral PA model, an experiment was performed using the actual Doherty PA in the test bench. The transmitter prototype consists of an ESG which has two digital to analog converters (DACs) and a RF up-converter, along with the PA. The receiver comprises an RF down-converter, a high speed analog to digital converter, and a digital down-converter. This receiver prototype can be constructed by a VSA. For a host DSP, a PC was used for delay compensation and the predistortion algorithm. As a test signal, two downlink W-CDMA carriers with 64 DPCH of Test Model 1 which has 3.84 Mchips/s and 9.8 dB of a crest factor was used as the input signal in the measurements in order to verify the compensation performance of the different PDs. All coefficients of PDs are identified by an indirect learning algorithm which is considered to be inverse modeling of the PA. During the verification process, a 256-entry LUT, 5 taps FIR filter for Hammerstein PD, the PELPD of the present invention (with 2 taps), and a $5^{th}$ order-2 delay memory polynomial were used. The choice of the number of taps was optimized from several measurements.

Figures 7, 8:
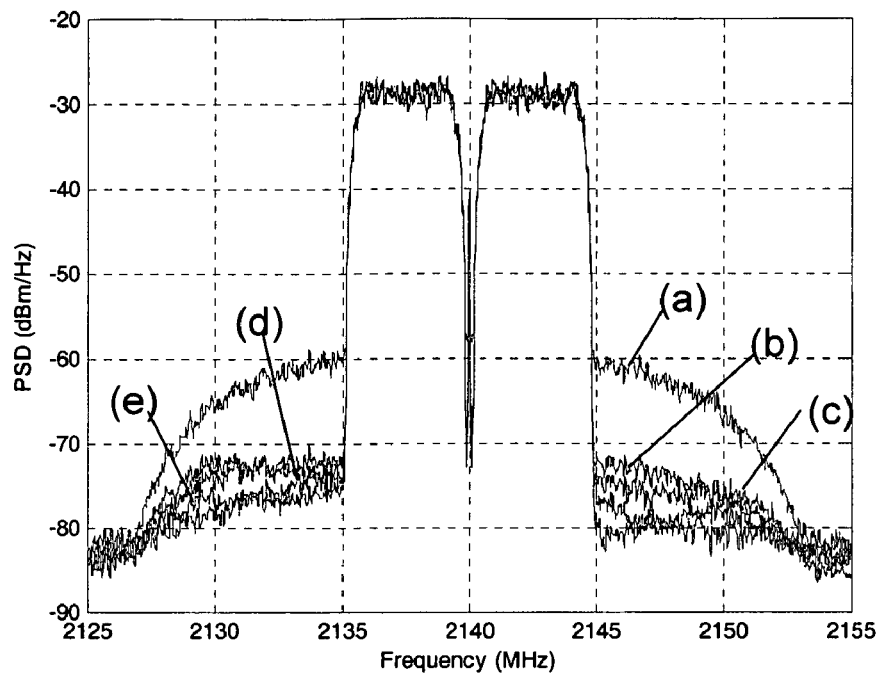
FIG. 7 is a graph showing measured linearization results for the 4 types of PD consisting of a memoryless LUT PD, a LUT Hammerstein PD, a piecewise pre-equalized PD of the present invention, and a memory polynomial PD using a single W-CDMA carrier, respectively.
FIG. 8 is a graph showing performance comparisons of the measurement results of the ACPR for the 4 types of PD consisting of a memoryless LUT PD, a LUT Hammerstein PD, a piecewise pre-equalized PD of the present invention, and a memory polynomial PD using a single W-CDMA carrier, respectively.

FIG. 7. is a graph showing the measured linearization results before and after linearization of the 4 types of PD using a single W-CDMA carrier, respectively. ACPR calculation at the output of the prototype transmitter, is performed at a frequency offset (5 MHz and −5 MHz) from the center frequency.

FIG. 8. is a graph showing performance comparisons of the measurement results of the ACPR for the 4 types of PD using a single W-CDMA carrier, respectively. The ACPR value for the transmitter with the Hammerstein PD having a 5 tap FIR filter is about 1 dB better than a LUT PD on the upper ACPR (5 MHz offset) and the same at the lower ACPR (−5 MHz offset). The PELPD of the present invention and a $5^{th}$ order-2 memory polynomial PD show close compensation performance in terms of ACPR. Both are able to improve the ACPR about 4 dB and 6 dB more than Hammerstein PD and a memoryless LUT PD, for the lower and upper ACPR, respectively.

The complexity of the PELPD method of the present invention and the memory polynomial method is also evaluated (neglecting LUT readings, writings, indexing, and calculation of the square root (SQRT) of the signal magnitude, because LUT indexing depends not only on the methods, but also on the variable, for example, magnitude, logarithm, power, and so on and the SQRT operation can be implemented in different ways). Therefore, the complexity is only estimated by counting the number of additions (subtractions) and multiplications per input sample. In order to consider a real hardware implementation, complex operations are converted into real operations and memory size is also considered. For example, one complex multiplication requires two real additions and four real multiplications. If N is the number of LUT entries, memory size required is 2N (I&Q LUTs).

FIG. 9 is a graph showing complexity estimation of the PELPD of the present invention. If the LUT has 256 entries and the filters have 2 taps, the PD requires 40 real additions (subtractions), 54 real multiplications per sample, and a memory size of 1542. The PELPD of the present invention requires the same number of additions and multiplications as the traditional Hammerstein PD, but requires more memory.

FIG. 10 is a graph showing complexity estimation of the memory polynomial PD using an RLS indirect learning algorithm. The number of arithmetic operations are given in FIG. 11, where O is equal to P(K+1). For example, P=5 and K=1 require 1342 real additions (subtractions), 1644 real multiplications per sample, and memory size of 24. In a comparison of the number of multiplications with the PELPD of the present invention, the memory polynomial PD requires 300 times more real multiplications per sample. Therefore, the complexity is significantly reduced by the PELPD method. In addition, the number of real multiplication for the memory polynomial method grows as the square power of the polynomial order and memory length.

In summary, the PELPD of the present invention, compared to the conventional Hammerstein approach, could reduce spectral regrowth more effectively and achieve a similar correction capability with the memory polynomial PD, but requires much less complexity.

Although the present invention has been described with reference to the preferred and alternative embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of reducing adjacent channel power ratio and compensating memory effects of multi-channel wideband communication systems using multiplexing modulation techniques comprising the steps of generating an address from samples of a baseband input signal of a communication system;
retrieving from a memoryless lookup table an entry in accordance with the address;
pre-equalizing the baseband input signal using the following equation:

$$z(n) = \sum_{k=0}^{K-1} W_k^m(|u(n)|) \cdot x(n-k) == \sum_{k=0}^{K-1} W_k^m(|u(n)|) \cdot u(n-k) \cdot F_m(|u(n-k)|),$$

wherein $W_k^m(|u(n)|)$ is the k-th tap and m-th indexed coefficient corresponding to the magnitude of the input signal, u(n); and
multiplying the pre-equalized baseband input signal and the lookup table entry.

2. The method of claim 1 wherein the entries in the lookup table are complex coefficients.

3. The method of claim 1 wherein the pre-equalizing step includes piecewise equalization.

4. The method of claim 3 wherein said the piecewise pre-equalizers use a finite impulse response filter rather than an infinite impulse response filter.

5. The method of claim 1 wherein the pre-equalizing step uses finite impulse response filtering.

6. The method of claim 1 further including updating the entries using an indirect learning method.

7. The method of claim 6 wherein the indirect learning method uses a least mean squares algorithm.

8. The method of claim 1 wherein the retrieving step is performed by determining the following equation:

$m = \text{round}(|u(n)| \cdot N),$ wherein u(n) is the input signal and the round function returns the nearest integer number which is the index (m) and N is the LUT size.

9. The method of claim 1 wherein the multiplying step is performed by the following equation:

$x(n) = u(n) \cdot F_m(|u(n)|),$ wherein $F_m(|u(n)|)$ is the complex coefficient of the memoryless LUT.

10. The method of claim 1 further comprising performing a second pre-equalizing step using the following equation:

$W^m(|u(n+1)|) = W^m(|u(n)|) + \mu \cdot (y_{FI}(n)^T)^* \cdot E(n)$ wherein $y_{FI}(n)$ is the input of the multiple equalizers in the feedback path, E(n) the error signal, p the step size, and * the complex conjugate.

11. A system for reducing adjacent channel power ratio and compensating memory effects of multi-channel wideband communication systems using multiplexing modulation techniques comprising an address generator for generating an address form samples of a baseband input signal of a communication system;
a memoryless lookup table having therein coefficients addressable according to the address;
a multiplier for combining the baseband input signal and the coefficients; lookup table entry; and
an equalizer for pre-equalizing the multiplier to compensate for memory effects in a power amplifier of the communications system, wherein pre-equalizing comprises using the following equation:

$$z(n) = \sum_{k=0}^{K-1} W_k^m(|u(n)|) \cdot x(n-k) == \sum_{k=0}^{K-1} W_k^m(|u(n)|) \cdot u(n-k) \cdot F_m(|u(n-k)|),$$

wherein $W_k^m(|u(n)|)$ is the k-th tap and m-th indexed coefficient corresponding to the magnitude of the input signal, u(n).

* * * * *